United States Patent
Yoshida et al.

(10) Patent No.: US 7,714,668 B2
(45) Date of Patent: May 11, 2010

(54) PHASE LOCKED LOOP CIRCUIT AND WIRELESS COMMUNICATION SYSTEM

(75) Inventors: Seiichiro Yoshida, Osaka (JP); Akihiro Sawada, Osaka (JP)

(73) Assignee: Panasonic Corporation, Osaka (JP)

( * ) Notice: Subject to any disclaimer, the term of this patent is extended or adjusted under 35 U.S.C. 154(b) by 73 days.

(21) Appl. No.: 12/194,836

(22) Filed: Aug. 20, 2008

(65) Prior Publication Data

US 2009/0102570 A1 Apr. 23, 2009

(30) Foreign Application Priority Data

Oct. 23, 2007 (JP) .............................. 2007-275387

(51) Int. Cl.
*H03L 7/087* (2006.01)
(52) U.S. Cl. .................... 331/16; 331/179; 331/1 A; 331/11; 327/156
(58) Field of Classification Search .................... 331/16, 331/10, 11, 44, 179, 1 A; 327/156, 159
See application file for complete search history.

(56) References Cited

U.S. PATENT DOCUMENTS

| | | | |
|---|---|---|---|
| 5,389,898 A | 2/1995 | Taketoshi et al. | |
| 6,747,519 B2 * | 6/2004 | Jaehne et al. | 331/16 |
| 7,023,283 B2 | 4/2006 | Kawasumi et al. | |
| 7,046,098 B2 * | 5/2006 | Staszewski | 331/158 |
| 7,180,375 B2 | 2/2007 | Maeda et al. | |
| 2006/0258312 A1 | 11/2006 | Uozumi et al. | |
| 2009/0273377 A1 * | 11/2009 | Ballantyne | 327/156 |

FOREIGN PATENT DOCUMENTS

JP 2004-7433 1/2004

* cited by examiner

*Primary Examiner*—Robert Pascal
*Assistant Examiner*—Ryan Johnson
(74) *Attorney, Agent, or Firm*—McDermott Will & Emery LLP

(57) ABSTRACT

In a PLL circuit including a VCO having a plurality of oscillation frequency bands, a TDC circuit calculates a phase difference between a predetermined reference signal from a fixed frequency divider and a PLL frequency-divided signal from a variable frequency divider. The TDC circuit detects the amount of time by which the phase of the PLL frequency-divided signal leads or lags with respect to that of the reference signal in one cycle of the reference signal, thereby detecting which of the signals has a higher frequency and which has a lower frequency. Therefore, for each oscillation frequency band, the frequency comparison is completed in one cycle of the reference signal, allowing an oscillation frequency band selection circuit to detect an optimum oscillation frequency band corresponding to a predetermined PLL output frequency in a short time.

9 Claims, 15 Drawing Sheets

PRIOR ART

PHASE LOCKED LOOP CIRCUIT AND WIRELESS COMMUNICATION SYSTEM

CROSS REFERENCE TO RELATED APPLICATION

This non-provisional application claims priority under 35 U.S.C. §119(a) on Patent Application No. 2007-275387 filed in Japan on Oct. 23, 2007, the entire contents of which are hereby incorporated by reference.

BACKGROUND OF THE INVENTION

The present invention relates to a PLL (phase locked loop) circuit which includes a VCO (voltage-controlled oscillator) having a plurality of oscillation frequency bands and multiplies the frequency of an input signal into a desired value to output the obtained desired value, and relates to a technique for effectively reducing the time required to detect, from the plurality of oscillation frequency bands, an optimum oscillation frequency band corresponding to a predetermined PLL oscillation frequency.

A PLL circuit is typically a circuit which compares the phases of two signals (i.e., a reference signal fref as a standard of comparison and a PLL frequency-divided signal fdiv obtained by dividing the output frequency of a VCO which oscillates at a frequency corresponding to an input voltage) and varies the control voltage Vt for the VCO in accordance with the magnitude of the phase difference to thereby output a desired oscillation frequency.

For example, a CS tuner (a communication satellite broadcasting receiver), in which the intermediate frequency widely ranges from 950 MHz to 2600 MHz, needs a PLL capable of wideband oscillation. However, with a single VCO, accomplishing such wideband oscillation is difficult, because very high frequency conversion gain is required. Therefore, a method is typically adopted, in which a VCO having a plurality of oscillation frequency bands is used, and switching among the VCO's oscillation frequency bands is done according to a PLL output frequency, thereby achieving wideband oscillation.

A method described in Japanese Laid-Open Publication No. 2004-7433 has been proposed as a method for selecting an optimum oscillation frequency band from a plurality of oscillation frequency bands. This conventional method and configuration will be described below.

FIG. 16 is a block diagram illustrating the minimum configuration of a conventional PLL circuit including a VCO having a plurality of oscillation frequency bands. In FIG. 16, a crystal oscillation signal 16 generated by a crystal oscillator 1 is input to a fixed frequency divider 2, in which the frequency of the crystal oscillation signal 16 is divided by a frequency divisor number. The output signal resulting from the frequency division is a reference signal 11 (fref) in the PLL.

A PLL output signal 14 (fout), which is the output signal of the VCO 10, is output as the output signal of the PLL circuit, while the frequency of the PLL output signal 14 is divided by a frequency divisor number by a variable frequency divider 7 in a later stage, thereby producing a PLL frequency-divided signal 15 (fdiv).

The frequency divisor number N of the variable frequency divider 7, which is determined by the reference signal's frequency and the PLL output signal's frequency, satisfies the following equation.

(PLL output signal's frequency)=reference signal's frequency×$N$

A phase comparator 5 compares the phase of the input reference signal 11 and that of the input PLL frequency-divided signal 15 and outputs digital phase error signals UP 17 and DOWN 18. According to the digital phase error signals output from the phase comparator 5, a charge pump 6 in the subsequent stage outputs an analog phase difference signal 19 corresponding to the phase difference between the reference signal 11 and the PLL frequency-divided signal 15.

Then, a loop filter 9 in the subsequent stage integrates the input analog phase difference signal 19, thereby producing a phase control signal. This phase control signal becomes a VCO control voltage 20 (Vt), and the PLL output signal 14 corresponding to this control voltage Vt is output from the VCO.

The oscillation frequency bands of a VCO typically have characteristics shown in FIG. 17. As stated above, it is difficult to cover a wide oscillation frequency band by a single band, and a method is thus generally adopted in which a plurality of narrow oscillation frequency bands are superimposed to cover a wide oscillation frequency range.

It is found from FIG. 17 that bands applicable to a predetermined PLL output frequency, i.e., the VCO oscillation frequency, are limited. For example, in FIG. 17, when the PLL circuit is made to oscillate at a frequency F1, no bands except for bands B2 and B3 allow the oscillation at the frequency F1. In addition, since the VCO's oscillation frequency characteristics inevitably change due to disturbances such as temperature variations and voltage variations, the PLL output frequency and a band to be used cannot be determined in advance in a one-to-one correspondence. It is thus necessary to detect an optimum band corresponding to a PLL output frequency each time the PLL circuit is used. This band detection is performed by an oscillation frequency band selection circuit 8. The oscillation frequency band selection circuit 8 compares a count number 21 counted for the reference signal 11 for a specified period of time by a first counter 3, which counts the number of rising edges of the reference signal 11, with a count number 22 counted for the PLL frequency-divided signal 15 for the same period of time by a second counter 4, which counts the number of rising edges of the PLL frequency-divided signal 15. If the count number 22 for the PLL frequency-divided signal 15 is greater than the count number 21 for the reference signal 11, this means that the oscillation frequency in the currently selected band is higher than the predetermined PLL output signal frequency. Thus, a band one oscillation frequency range lower is reselected, and the same frequency comparison is performed. Conversely, if the count number 22 for the PLL frequency-divided signal 15 is smaller than the count number 21 for the reference signal 11, this means that the oscillation frequency in the currently selected band is lower than the predetermined PLL output signal frequency. Thus, a band one oscillation frequency range higher is reselected, and the same frequency comparison is performed. By repeating this frequency comparison, the band closest to the predetermined PLL output signal frequency is finally detected and selected.

During band detection, the VCO control voltage 20 (Vt) is always set to the value of VCO power supply voltage×½(VDDVCO/2) for each band, so that after the completion of the band detection, even if the VCO's oscillation frequency characteristics vary due to disturbances such as temperature variations and voltage variations, a situation in which frequency oscillation using the detected band becomes impossible is prevented as much as possible by comparing the reference frequency with the oscillation frequency obtained in each band when Vt=VDDVCO/2. The foregoing is the operation principle of the PLL circuit according to the conventional technique which includes the VCO having a plurality of oscillation frequency bands.

In this manner, in the conventional method and configuration described above, the frequency counters count, for a specified period of time, the frequency of the reference signal fref in the PLL circuit and the frequency of the PLL frequency-divided signal fdiv, which is obtained by dividing the frequency of a PLL output signal output from the VCO with the variable frequency divider, and these count numbers are compared to determine which is greater and which is smaller. If the comparison result shows that the count number for the reference signal fref is greater than the count number for the PLL frequency-divided signal fdiv, a band one oscillation frequency range higher is selected, and, on the other hand, if the comparison result shows that the count number for the PLL frequency-divided signal fdiv is greater than the count number for the reference signal fref, a band one oscillation frequency range lower is selected. Thereafter, the frequency counters again count the frequency of the reference signal fref and the frequency of the PLL frequency-divided signal fdiv, and a transition to the band one oscillation frequency range higher or lower is made. By repeating this, an oscillation frequency band, in which the frequency count difference between the reference signal fref and the PLL frequency-divided signal fdiv is minimum, is finally detected, and this oscillation frequency band is the optimum oscillation frequency band corresponding to the PLL output frequency.

Nevertheless, the conventional configuration and method, in which the frequency counters count the rising edges of the reference signal fref and of the PLL frequency-divided signal fdiv for a specified period of time, have a problem with a lower accuracy count. Specifically, if there is a rising-edge phase difference between the reference signal fref and the PLL frequency-divided signal fdiv at the time of the start of counting, a maximum error of 1 will occur in the difference between the count numbers for these signals after the specified period of time, and hence the frequency difference between the reference signal fref and the PLL frequency-divided signal fdiv cannot be measured accurately. There is also a problem in that in order to measure the frequency difference accurately, the time in which the counting for the reference signal fref and the PLL frequency-divided signal fdiv is performed must be increased. This problem becomes more serious, as the frequency difference between adjacent bands becomes small.

If the oscillation band detection time is shortened, it is possible to reduce lockup time, which is the time required for the PLL circuit to operate stably at a predetermined frequency from the time at which the PLL circuit starts oscillating. Naturally, the shorter the oscillation band detection time is, the higher the performance of the PLL circuit is. On the other hand, if the oscillation band detection time is increased to improve the accuracy in detecting the optimum oscillation band, a reduction in analog lockup time, caused by the use of an oscillation frequency band unsuitable for the predetermined PLL oscillation frequency, and an increase in the number of frequency components other than the desired frequency are prevented, which also leads to an improvement in the performance of the PLL circuit. That is, there is a trade-off between the oscillation band detection time and the oscillation band detection accuracy.

SUMMARY OF THE INVENTION

It is therefore an object of the invention to provide a high-performance PLL circuit including a VCO having a plurality of oscillation frequency bands, in which a reduction in oscillation band detection time and an increase in oscillation band detection accuracy are both achieved.

In order to achieve the above object, according to the invention, a TDC circuit for detecting and outputting a phase difference between two input signals is used to detect the amount of time by which the phase of a PLL frequency-divided signal, for example, leads or lags in one cycle of a reference signal, thereby detecting which of the signals, the reference signal or the PLL frequency-divided signal, has a higher frequency and which has a lower frequency in a shorter time as compared with the conventional technique, so that a transition to the next oscillation frequency band can be made immediately.

Specifically, an inventive PLL circuit includes: a voltage-controlled oscillator having a plurality of oscillation frequency bands; an oscillation frequency band selection circuit for detecting a required oscillation frequency band from the plurality of oscillation frequency bands of the voltage-controlled oscillator; a variable frequency divider for dividing the frequency of a PLL output signal, which is an output signal from the voltage-controlled oscillator, by a frequency divisor number to output a PLL frequency-divided signal; a TDC circuit for detecting and outputting a phase difference between a predetermined reference signal and the PLL frequency-divided signal from the variable frequency divider; and a frequency counter for counting the number of rising edges of the PLL frequency-divided signal from the variable frequency divider for a specified period of time and outputting the count number. The oscillation frequency band selection circuit detects and selects an optimum oscillation frequency band corresponding to a predetermined PLL output frequency by using a signal indicating the phase difference between the reference signal and the PLL frequency-divided signal detected by the TDC circuit.

According to the invention, the TDC circuit for detecting and outputting a phase difference between two input signals calculates a phase difference between the PLL reference signal and the PLL frequency-divided signal, which is obtained by dividing the frequency of the PLL output signal with the variable frequency divider, on a rising edge of the reference signal and then calculates a phase difference between the reference signal and the PLL frequency-divided signal on the next rising edge of the reference signal in the same manner. From information on the two calculated phase differences, it is possible to detect the amount of time by which the phase of the PLL frequency-divided signal leads or lags with respect to that of the reference signal in one cycle of the reference signal, and hence quickly detect which of the signals, the reference signal or the PLL frequency-divided signal, has a higher frequency and which has a lower frequency. This enables a transition to the next oscillation frequency band to be made immediately so that the operation for detecting the optimum oscillation frequency band corresponding to the PLL output frequency is continued.

Another inventive PLL circuit includes: a voltage-controlled oscillator having a plurality of oscillation frequency bands; an oscillation frequency band selection circuit for detecting a required oscillation frequency band from the plurality of oscillation frequency bands of the voltage-controlled oscillator; a variable frequency divider for dividing the frequency of a PLL output signal, which is an output signal from the voltage-controlled oscillator, by a frequency divisor number to output a PLL frequency-divided signal; a TDC circuit for detecting and outputting a phase difference between a predetermined reference signal and the PLL frequency-divided signal from the variable frequency divider; a first frequency counter for counting the number of rising edges of the PLL frequency-divided signal from the variable frequency divider for a specified period of time and outputting the count number; and a second frequency counter for counting the number of rising edges of the reference signal for a specified period of time and outputting the count number. The oscillation frequency band selection circuit detects and selects an optimum oscillation frequency band corresponding to a predetermined PLL output frequency by using the count number indicating the frequency of the PLL frequency-divided signal counted by the first frequency counter, the count number indicating the frequency of the reference signal counted by the second frequency counter, and a signal indicating the phase difference between the reference signal and the PLL frequency-divided signal detected by the TDC circuit.

Thus, according to the invention, on a rising edge of the reference signal, the first frequency counter and the second frequency counter start counting the frequency of the PLL frequency-divided signal and the frequency of the reference signal, respectively, while at the same time the TDC circuit calculates a phase difference between the reference signal and the PLL frequency-divided signal obtained by dividing the frequency of the PLL output signal with the variable frequency divider. Then, on a rising edge of the reference signal after a specified period of time, the counting of the frequency of the reference signal and of the frequency of the PLL frequency-divided signal is stopped, while at the same time the TDC circuit calculates a phase difference between the reference signal and the PLL frequency-divided signal in the same manner. From the calculated count numbers for the reference signal and for the PLL frequency-divided signal, and information on the two phase differences, it is possible to detect the amount of time by which the phase of the PLL frequency-divided signal leads or lags with respect to that of the reference signal during the specified period of time. Hence it is possible to quickly detect which of the signals, the reference signal or the PLL frequency-divided signal, has a higher frequency and which has lower frequency, thereby enabling a transition to the next oscillation frequency band to be made immediately so that the operation for detecting the optimum oscillation frequency band corresponding to the PLL output frequency is continued.

Another inventive PLL circuit includes: a voltage-controlled oscillator having a plurality of oscillation frequency bands; an oscillation frequency band selection circuit for detecting a required oscillation frequency band from the plurality of oscillation frequency bands of the voltage-controlled oscillator; a variable frequency divider for dividing the frequency of a PLL output signal, which is an output signal from the voltage-controlled oscillator, by a frequency divisor number to output a PLL frequency-divided signal; a TDC circuit for detecting and outputting a phase difference between a predetermined reference signal and the PLL output signal; and a first frequency counter for counting the number of rising edges of the PLL output signal for a specified period of time and outputting the count number. The oscillation frequency band selection circuit detects and selects an optimum oscillation frequency band corresponding to a predetermined PLL output frequency by using the count number indicating the frequency of the PLL output signal counted by the first frequency counter and a signal indicating the phase difference between the reference signal and the PLL output signal detected by the TDC circuit.

Thus, according to the invention, on a rising edge of the reference signal, the first frequency counter starts counting the frequency of the PLL output signal, while at the same time the TDC circuit calculates a phase difference between the reference signal and the PLL output signal. Then, on the next rising edge of the reference signal, the counting of the frequency of the PLL output signal is stopped, while at the same time the TDC circuit calculates a phase difference between the reference signal and the PLL output signal in the same manner. From the obtained count number for the PLL output signal and information on the two phase differences, it is possible detect how much faster the PLL output signal operates than the reference signal in one cycle of the reference signal. Therefore, by a comparison with the predetermined PLL frequency divisor number, it is possible to detect whether the oscillation frequency range of the currently selected oscillation frequency band is higher or lower than that of the optimum oscillation frequency band, thereby allowing a transition to the next oscillation frequency band to be made immediately so that the operation for detecting the optimum oscillation frequency band corresponding to the PLL output frequency is continued.

Another inventive PLL circuit includes: a voltage-controlled oscillator having a plurality of oscillation frequency bands; an oscillation frequency band selection circuit for detecting a required oscillation frequency band from the plurality of oscillation frequency bands of the voltage-controlled oscillator; a variable frequency divider for dividing the frequency of a PLL output signal, which is an output signal from the voltage-controlled oscillator, by a frequency divisor number to output a PLL frequency-divided signal; a TDC circuit to which a predetermined reference signal and another signal are input and which detects and outputs a phase difference between these two input signals; a first frequency counter for counting the number of rising edges of an input signal for a specified period of time and outputting the count number; and an oscillation frequency band detection signal selection circuit for selecting either the PLL frequency-divided signal from the variable frequency divider or the PLL output signal from the voltage-controlled oscillator as the other of the two signals input to the TDC circuit, which is other than the reference signal, and as the signal input to the first frequency counter. The oscillation frequency band selection circuit detects and selects an optimum oscillation frequency band corresponding to a predetermined PLL output frequency by using the frequency count number counted by the first frequency counter and a signal indicating the phase difference between the reference signal and the signal selected by the oscillation frequency band detection signal selection circuit detected by the TDC circuit.

Thus, according to the invention, since the oscillation frequency band detection signal selection circuit selects either the PLL frequency-divided signal or the PLL output signal as the signal to be compared with the reference signal by the TDC circuit, the method in which the operation for detecting the optimum oscillation frequency band corresponding to the PLL output frequency is performed can be selected appropriately according to the frequency of the PLL output signal.

In one embodiment of the invention, the PLL circuit includes a detection signal automatic specification circuit for specifying, as an instruction to the oscillation frequency band detection signal selection circuit, whether the oscillation frequency band detection signal selection circuit should select either the PLL frequency-divided signal from the variable frequency divider or the PLL output signal from the voltage-controlled oscillator, in accordance with the predetermined PLL output frequency.

Thus, according to the invention, since the detection signal automatic specification circuit and the oscillation frequency band detection signal selection circuit automatically select either the PLL frequency-divided signal or the PLL output signal as the signal to be compared with the reference signal by the TDC circuit, the method in which the operation for detecting the optimum oscillation frequency band corresponding to the PLL output frequency is performed can be selected automatically and appropriately according to the frequency of the PLL output signal.

DETAILED DESCRIPTION OF THE INVENTION

Hereinafter, the preferred embodiments of the invention will be described with reference to the accompanying drawings.

First Embodiment

Figure 1:
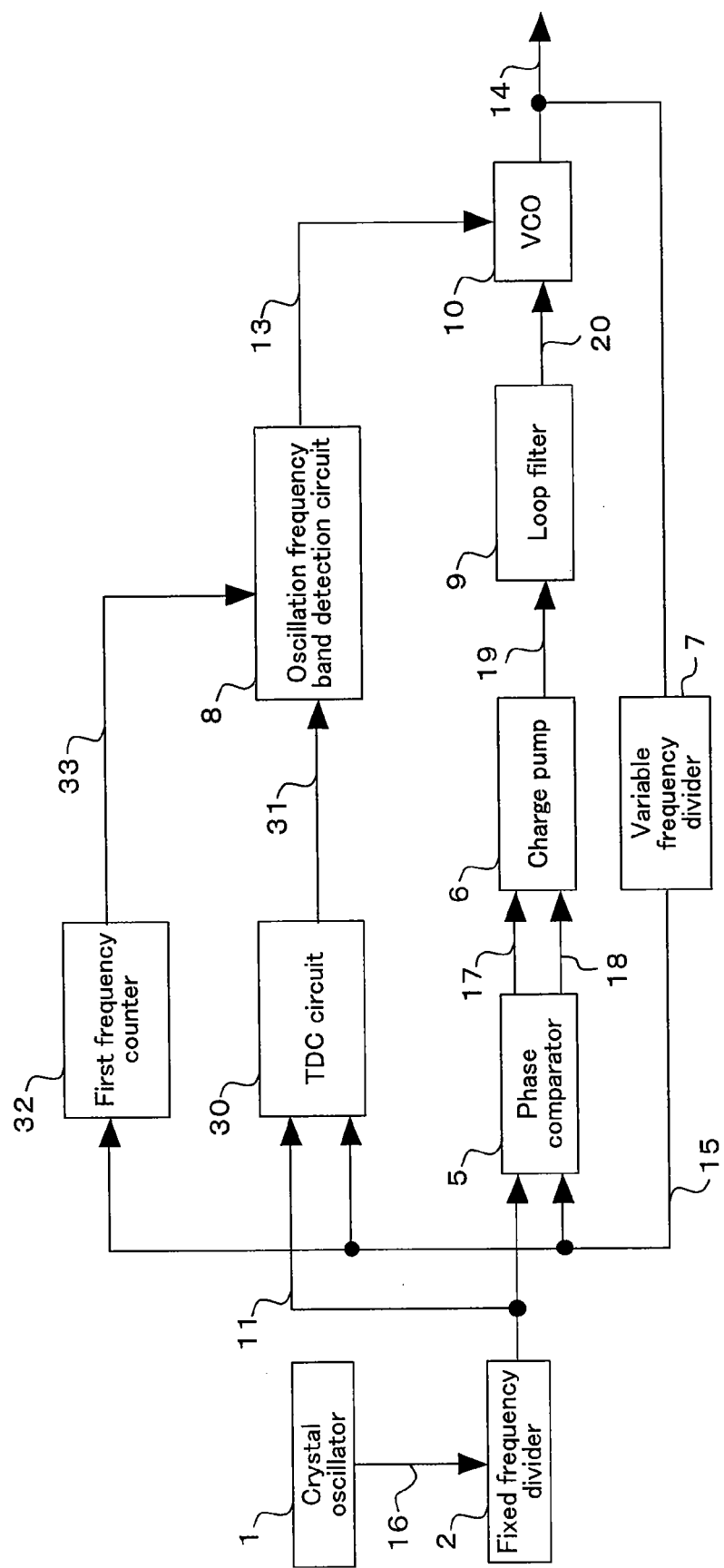
FIG. 1 illustrates the configuration of a PLL circuit according to a first embodiment of the invention.

FIG. 1 illustrates the configuration of a PLL circuit including a VCO having a plurality of oscillation frequency bands according to a first embodiment of the invention.

In contrast to the conventional configuration, the PLL circuit according to the first embodiment is characterized in that a TDC circuit 30 for detecting a phase difference between two input signals is used to detect a phase difference between a reference signal 11 and a PLL frequency-divided signal 15 and to output a phase error signal 31, and that an oscillation frequency band selection circuit 8 detects an optimum oscillation frequency band corresponding to a predetermined PLL output frequency on the basis of the phase error signal 31 and a count number 33 counted for the PLL frequency-divided signal by a first frequency counter 32.

Now, a description will be made of operation of the TDC circuit 30. The TDC circuit 30, which is also called a time digital conversion circuit, uses one of two input signals as a reference signal and standardizes a phase difference between the rising edges of the reference signal and of the other input signal in one cycle of the reference signal, thereby calculating the phase difference. Although the TDC circuit 30 may be configured in several ways, FIG. 2 illustrates a configuration of the TDC circuit, in which delay devices are used, by way of example.

Figure 2:
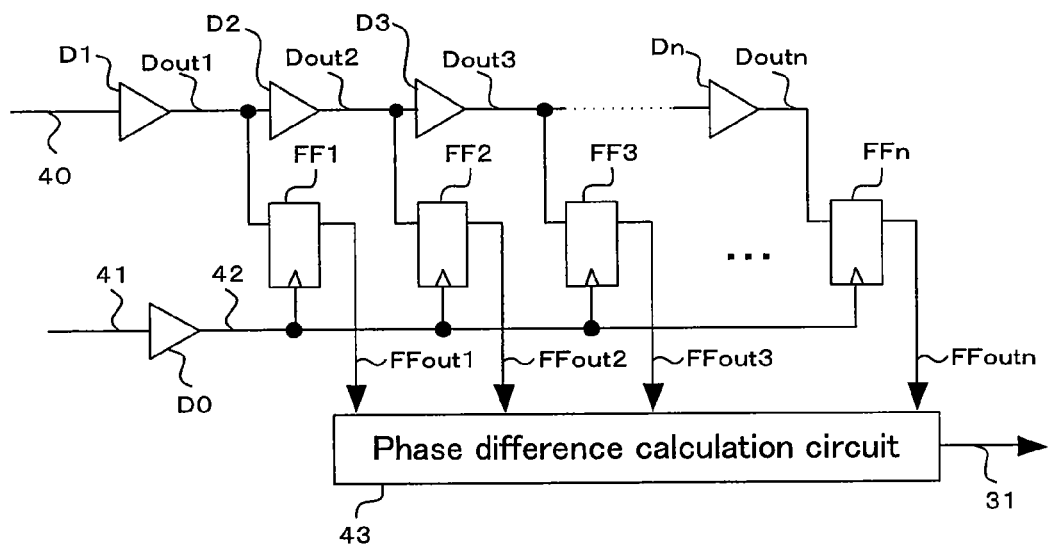
FIG. 2 illustrates a configuration for a TDC circuit included in the PLL circuit of the first embodiment.
Figure 3:
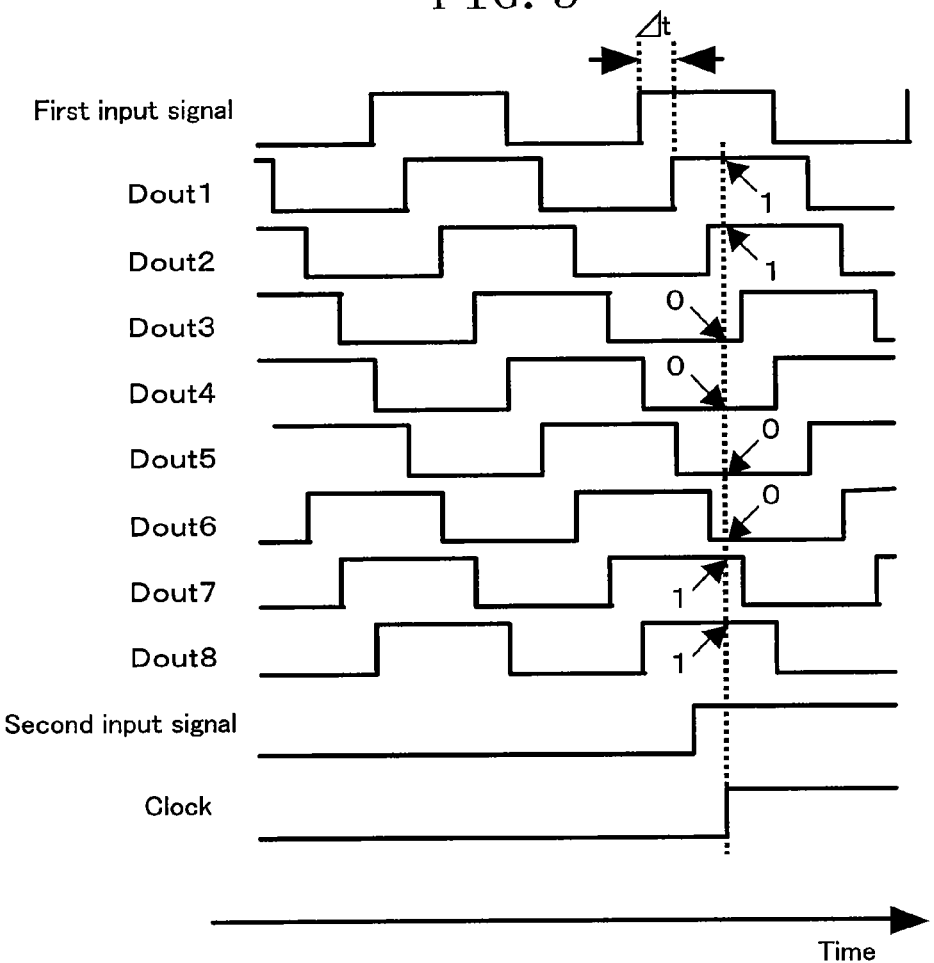
FIG. 3 illustrates the output signals of delay devices in the TDC circuit.
Figure 4:
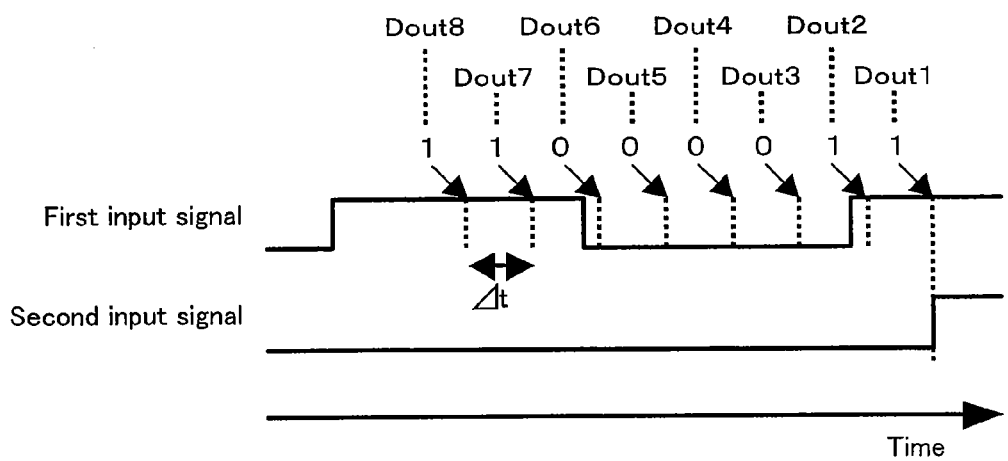
FIG. 4 illustrates the relation between the output signals of the delay devices in the TDC circuit and a first input signal.

In FIG. 2, each time a first input signal 40 passes through each of the stages in which delay devices D1 to Dn are disposed, a signal delayed just by a small amount of time $\Delta t$ is provided to the delay device in the next stage. Consequently, the output signals Dout1 to Doutn of the respective delay devices have waveforms shown in FIG. 3 (Dout1 to Dout8 are shown in FIG. 3). And if the signals Dout1 to Doutn are latched by respective flip-flops FF1 to FFn on rising edges of a delayed-signal capture clock 42, which is obtained by delaying a second input signal 41 with a delay device D0 just by one stage, to thereby put the output signals FFout1 to FFoutn of the flip-flops FF1 to FFn in this order, 0 and 1 appear continuously. For example, in the case of FIG. 3, if the output signals Dout8 to Dout1 of the delay devices are put in this order, the result is 11000011. This numerical value is equal to the state of the first input signal obtained at time intervals of the small amount of time $\Delta t$ before the time of a rising edge of the second input signal as shown in FIG. 4.

Figure 5:
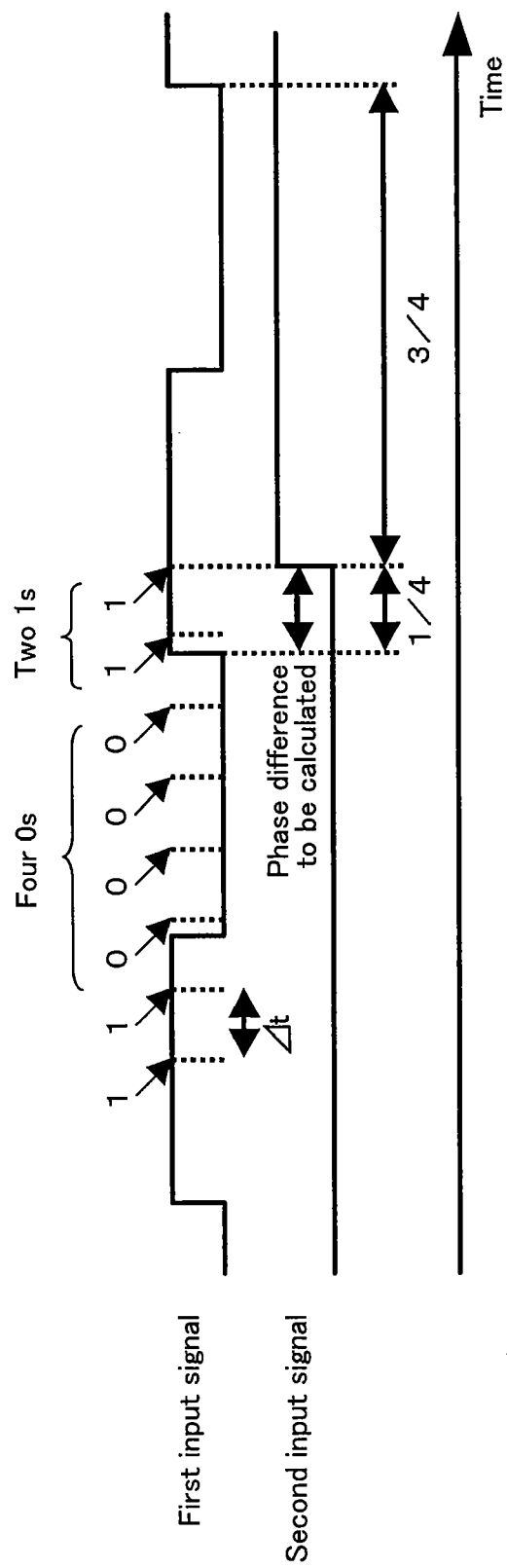
FIG. 5 illustrates the relation between the first and second input signals and a phase difference to be calculated in the TDC circuit when Dout1=1.

Next, a description will be made of a method in which a phase difference calculation circuit 43 calculates a phase difference between the first input signal and the second input signal based on the output signals Dout1 to Doutn of the delay devices. The phase difference to be calculated is obtained by standardizing the amount of time by which a rising edge of the second input signal lags behind a rising edge of the first input signal in one cycle of the first input signal as shown in FIG. 5. In the example in FIG. 5, if the output signals Dout8 to Dout1 of the delay devices are put in this order, the result is 11000011. When this numerical value is seen from the side closer to Dout1, it is found that there are two consecutive 1s and four consecutive 0s. This is equivalent to the fact that the period of time in which the first input signal is 1 is $2 \times \Delta t$ and the period of time in which the first input signal is 0 is $4 \times \Delta t$ immediately before the time of the rising edge of the second input signal, if a quantization error is ignored. Also, considering that the delay device output signals located before and after the output signals Dout3 to Dout6 indicating that the first input signal is 0, i.e., Dout2 and Dout7, are both 1, and if it is assumed that the time period during which the first input signal is 0 is equal to the time period during which the first input signal is 1, then one cycle of the first input signal is $2 \times 4 \times \Delta t = 8 \times \Delta t$. Accordingly, the cycle of the first input signal is $8 \times \Delta t$, while the phase difference to be calculated in FIG. 5 is $2 \times \Delta t$. Thus, when standardized in the cycle of the first input signal, the phase difference to be calculated is $(2 \times \Delta t)/(8 \times \Delta t) = \frac{1}{4}$.

Figure 6:
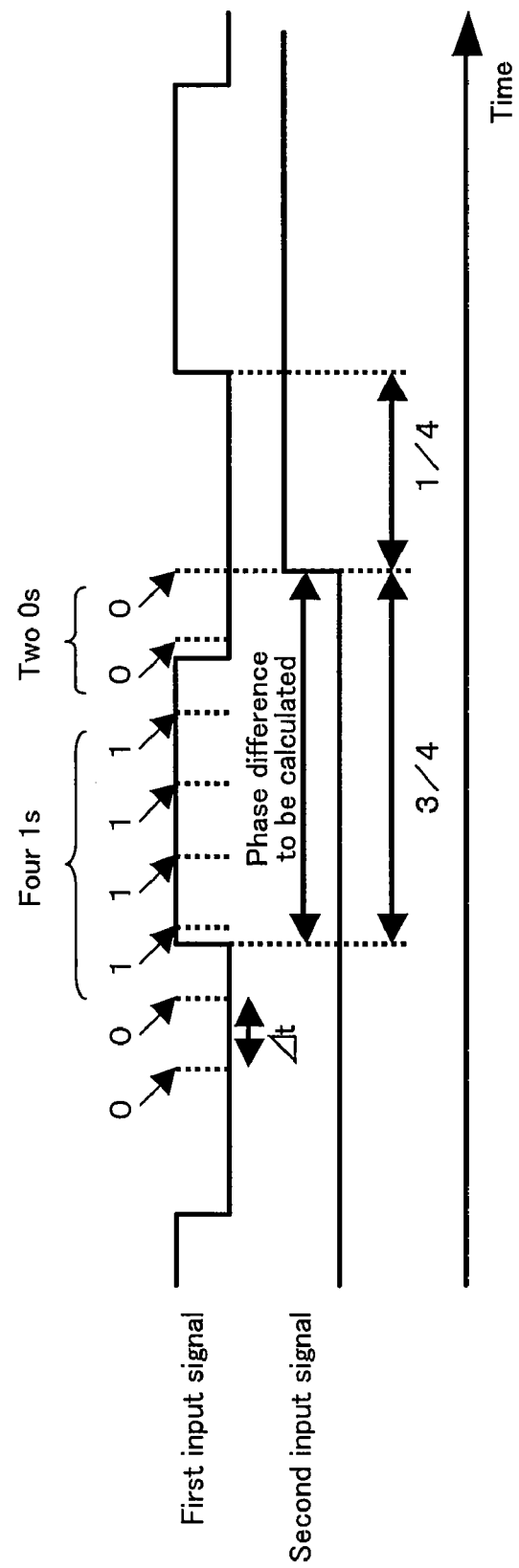
FIG. 6 illustrates the relation between the first and second input signals and a phase difference to be calculated in the TDC circuit when Dout1=0.

In the example set forth above, the phase difference calculation method in the case of Dout1=1 has been described. When Dout1=0 as shown in FIG. 6, however, the calculation is performed in a different manner. In the example shown in FIG. 6, if the output signals Dout8 to Dout1 of the delay devices are put in this order, the result is 00111100. When this value is seen from the side closer to Dout1, it is found that there are two consecutive 0s and four consecutive 1s. One cycle of the first input signal remains unchanged and is 2×4×Δt=8×Δt, however, the phase difference to be calculated is the amount of time by which a rising edge of the second input signal lags behind a rising edge of the first input signal and is thus obtained by dividing the sum of the time period during which the 0s are consecutive and the time period during which the 1s are consecutive by one cycle of the first input signal. Hence, the phase difference to be calculated is (2×Δt+4×Δt)/(8×Δt)=¾.

In the above-described example, since one cycle of the first input signal is expressed as 8×Δt, only eight kinds of phase differences are obtainable, and the resolution of the phase difference is thus low. However, if the delay time per delay-device stage is reduced so as to increase the number of delay-device stages expressing one cycle of the first input signal, it is possible to increase the resolution of the phase difference.

In the case of the TDC circuit configured in the above-described manner, the cycle of the first input signal and the phase difference between the first input signal and the second input signal are calculated from the consecutive 0s or is in the output signals Dout. Therefore, when the value of (Δt×the number of delay-device stages) is less than one cycle of the first input signal, the phase difference between the first input signal and the second input signal cannot be calculated. That is, the equation (Δt×the number of delay-device stages)=(one cycle of the first input signal) must be satisfied.

Figure 7:
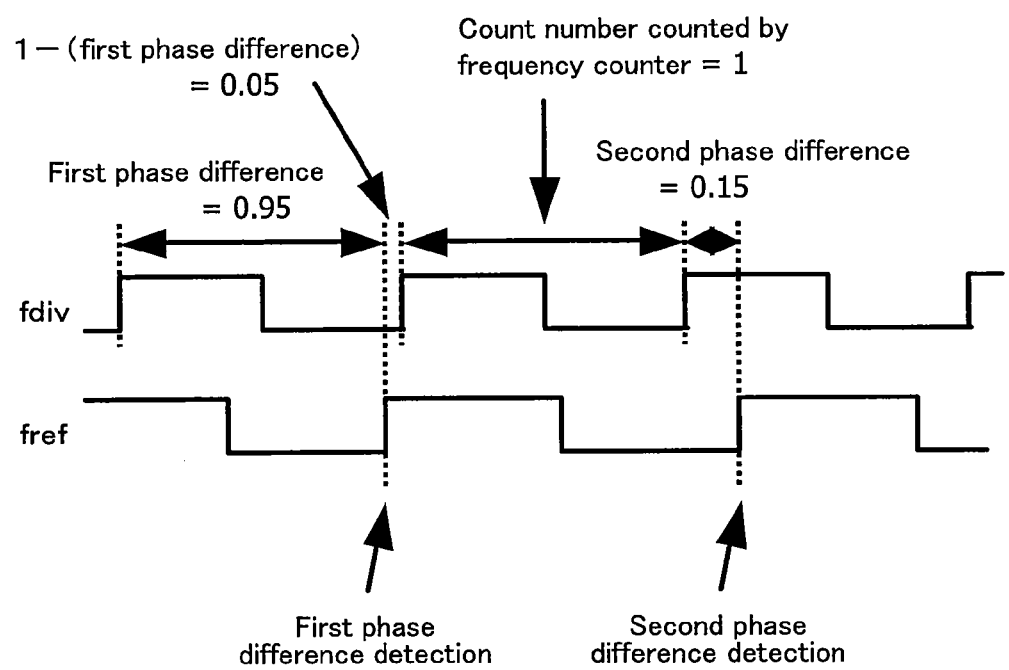
FIG. 7 is a view for explaining operation in which a frequency difference between a reference signal fref and a PLL frequency-divided signal fdiv is detected in the PLL circuit of the first embodiment.

The PLL circuit according to the first embodiment is characterized in that the phase difference between the reference signal fref and the PLL frequency-divided signal fdiv calculated by this TDC circuit 30 is used in band detection. As shown in FIG. 7, a phase difference between the reference signal fref and the PLL frequency-divided signal fdiv is detected on each of two consecutive rising edges of the reference signal fref. For example, suppose a case in which the result of the first phase error detection was 0.9, the result of the second phase error detection was 0.2, and the result of the counting of the frequency of the PLL frequency-divided signal fdiv by the frequency counter 32 during this duration was 1. In this case, since the count number for the PLL frequency-divided signal fdiv during one cycle of the reference signal fref is 1+(1−0.95)+0.15=1.2, the frequency of the PLL frequency-divided signal fdiv needs to be 1.2 times faster than that of the reference signal fref.

In this manner, in the PLL circuit according to the first embodiment, since the determination as to which of the signals, the reference signal fref or the PLL frequency-divided signal fdiv, has a higher frequency and which has a lower frequency is made in a very short period of time, i.e., in one cycle of the reference signal fref, a transition to the next band detection can be made quickly, thereby significantly reducing the time required to detect an optimum oscillation frequency band corresponding to the predetermined PLL output frequency.

As in the conventional technique described above, in a method in which only frequency counters are used to compare the frequency of the reference signal fref with that of the PLL frequency-divided signal fdiv, frequency count time equal to at least five cycles of the reference signal fref is necessary to detect that the frequency of the PLL frequency-divided signal fdiv is 1.2 times faster than that of the reference signal fret This is because only after a count of five cycles, the count for the reference signal fref is 5 and the count for the PLL frequency-divided signal fdiv is 6, i.e., a difference of 1 or greater appears. Also, when the frequency difference between the reference signal fref and the PLL frequency-divided signal fdiv is smaller, it will take more time to determine the frequency difference. The PLL circuit according to the first embodiment is, in other words, a PLL circuit capable of counting a fractional frequency and thus capable of determining a frequency difference in a short time, while only an integral frequency can be counted by the conventional technique. This fractional frequency counting works most effectively when a predetermined PLL output frequency is nearly in the center between two adjacent bands. In this case, to select the optimum band closest to the PLL output frequency, not only the determination as to which of the signals, the reference signal fref or the PLL frequency-divided signal fdiv, has a higher frequency has to be made, but also which frequency is higher by what value must be obtained for the comparison. Therefore, without the use of a TDC circuit, there was no way to detect the optimum band other than counting frequencies for a long time until an integral frequency difference appears. TDC circuits were originally developed for the purpose of measuring minimum time in the field of physics and have been applied to electronic circuits only recently. In particular, it is not an easy thing to come up with a technique for applying a TDC circuit to band detection in a PLL circuit, and hence it can be said that the present invention is an epoch-making technique.

Second Embodiment

Figure 8:
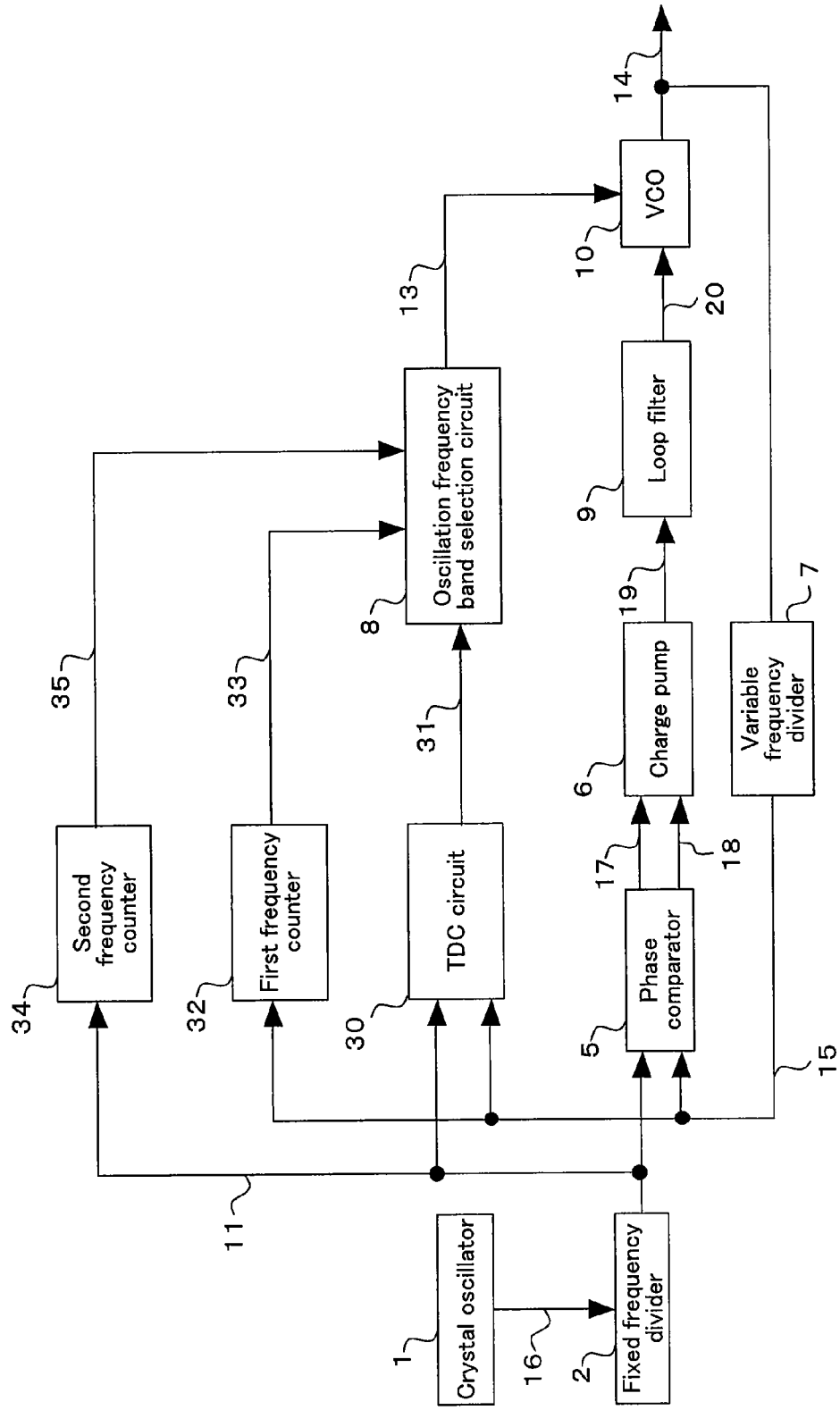
FIG. 8 illustrates the configuration of a PLL circuit according to a second embodiment of the invention.

Next, FIG. 8 illustrates the configuration of a PLL circuit according to a second embodiment of the invention.

The configuration of the PLL circuit according to the second embodiment differs from that of the PLL circuit according to the first embodiment in that a second frequency counter 34 for counting the number of rising edges of a reference signal 11 for a specified period of time and outputting the count number is added, and that the count number 35 indicating the frequency of the reference signal 11 output from the second frequency counter 34 is input to an oscillation frequency band selection circuit 8.

In the first embodiment, the phase difference comparison between the reference signal fref and the PLL frequency-divided signal fdiv is made in one cycle of the reference signal fref. Thus, if the frequency difference between the reference signal fref and the PLL frequency-divided signal fdiv is slight, the phase difference therebetween appearing in one cycle of the reference signal fref becomes slight, in which case a TDC circuit having high resolution is needed. In order to achieve a TDC circuit having high resolution, delay time Δt per delay-device stage may be reduced. But if the equation (Δt×the number of delay-device stages in the TDC circuit)=(one cycle of the PLL frequency-divided signal fdiv) is not satisfied, the phase error cannot be detected correctly. Therefore, a reduction in the delay time Δt inevitably results in an increase in the number of delay-device stages in the TDC circuit 30. This, however, causes the circuit area and power consumption to be increased, and thus the delay time Δt cannot be reduced without careful consideration. In view of this, the number of delay-device stages in the TDC circuit 30 may be reduced instead of increasing the time during which the frequency of the reference signal fref is compared with that of the PLL frequency-divided signal fdiv for each band to more than one cycle of the reference signal fref.

Figure 9:
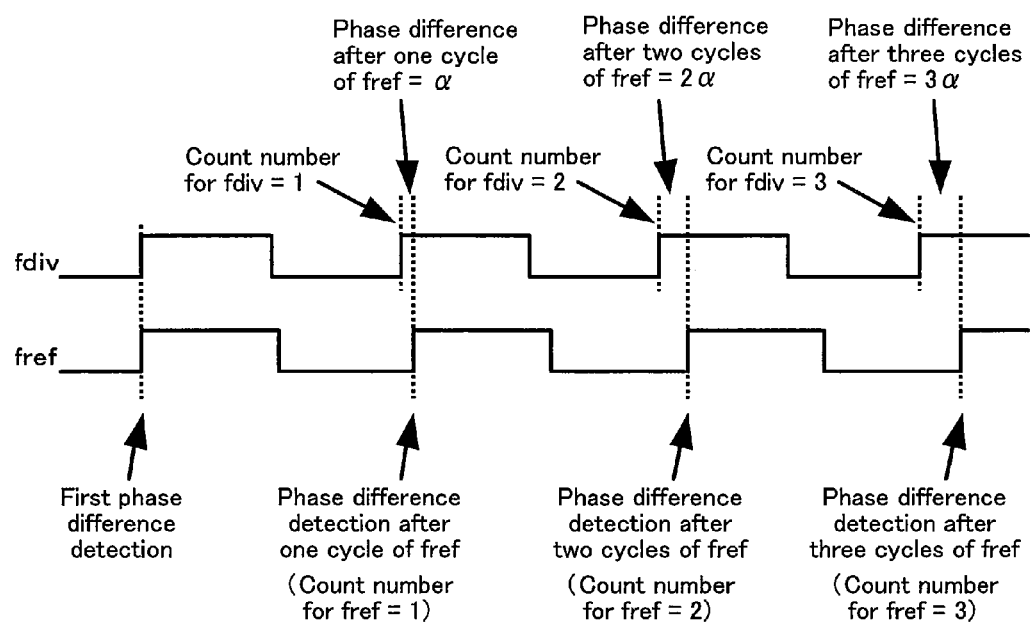
FIG. 9 is a view for explaining operation in which a frequency difference between a reference signal fref and a PLL frequency-divided signal fdiv is detected in the PLL circuit of the second embodiment.

To be specific, this is achieved by also using, in band detection, a count number indicating the frequency of the reference signal fref counted by the second frequency counter 34 shown in FIG. 8. As shown in FIG. 9, if a phase difference a occurring after one cycle of the reference signal fref is small, the TDC circuit 30 whose resolution is high enough to detect this phase difference a is needed. However, after two cycles of the reference signal fref, the phase difference is 2 a, and after three cycles, 3 a. In this manner, as the phase difference detection time is increased, the phase difference is increased, and the resolution required by the TDC circuit 30 is lowered. Since integral count numbers for the PLL frequency-divided signal fdiv and the reference signal fref which have increased during this duration are counted by the first frequency counter 32 and the second frequency counter 34, respectively, no phase-difference detection error occurs, even if the frequency difference between the reference signal fref and the PLL frequency-divided signal fdiv is large.

In this way, in the PLL circuit according to the second embodiment, the resolution required by the TDC circuit 30 is lowered instead of increasing the time during which the frequency of the reference signal fref is compared with that of the PLL frequency-divided signal fdiv for each band to more than one cycle of the reference signal fref. This enables the TDC circuit 30 to be reduced in circuit area and power consumption, while reducing the time during which the frequency of the reference signal fref is compared with that of the PLL frequency-divided signal fdiv for each band, as compared with the conventional band detection performed only by frequency comparisons made by frequency counters.

Third Embodiment

Next, a third embodiment of the invention will be described.

Figure 10:
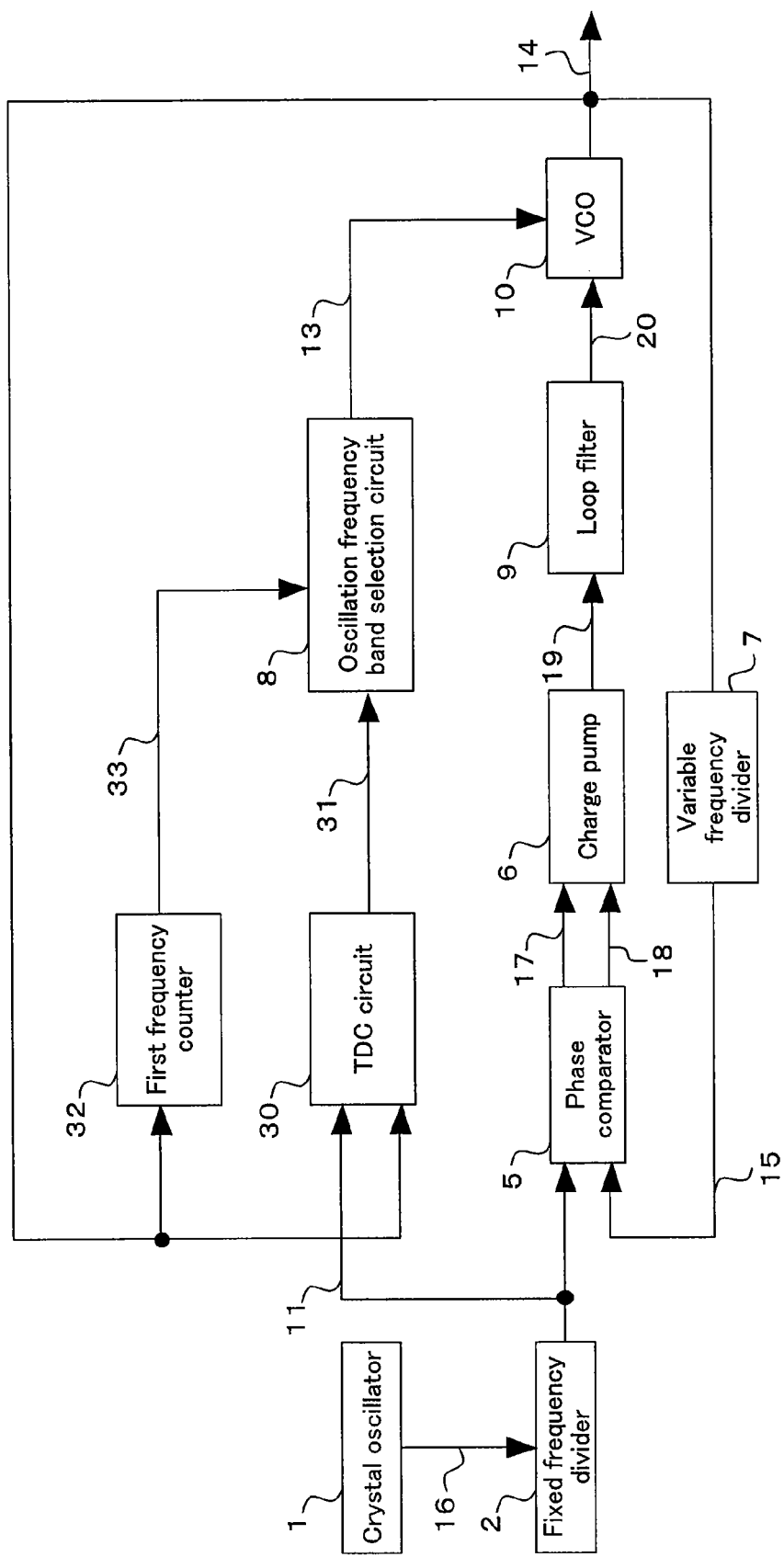
FIG. 10 illustrates the configuration of a PLL circuit according to a third embodiment of the invention.

FIG. 10 illustrates the configuration of a PLL circuit according to the third embodiment of the invention. The configuration of the PLL circuit according to the third embodiment differs from that of the PLL circuit according to the first embodiment in that a PLL output signal 14 instead of a PLL frequency-divided signal 15 is input to a first frequency counter 32, while at the same time the PLL output signal 14 instead of the PLL frequency-divided signal 15 is also input to a TDC circuit 30.

Figure 11:
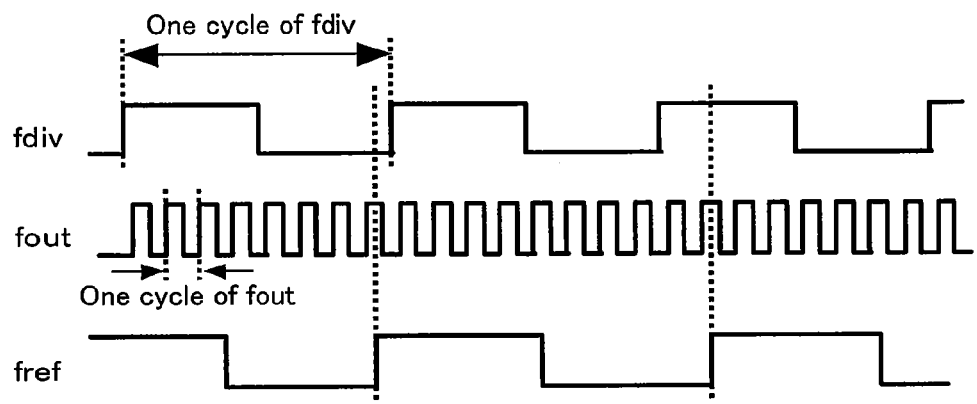
FIG. 11 illustrates the frequency relation among a PLL frequency-divided signal fdiv, a PLL output signal fout, and a reference signal fref in the PLL circuit of the third embodiment.

In order to correctly detect a phase difference between two input signals with the TDC circuit 30, the equation ($\Delta t \times$ the number of delay-device stages in the TDC circuit 30)=(one cycle of the first input signal) must be satisfied as previously stated. Typically, as shown in FIG. 11, the frequency of a PLL output signal fout is several tens to several hundreds times higher than that of a PLL frequency-divided signal fdiv, and hence the cycle of the PLL frequency-divided signal fdiv is several tens to several hundreds times longer than that of the PLL output signal fout. Therefore, if delay time $\Delta t$ is the same, in a case in which the PLL frequency-divided signal fdiv is used as the first input signal, the number of delay-device stages in the TDC circuit 30 must be increased by several tens to several hundreds of times as compared with a case in which the PLL output signal fout is used as the first input signal. Conversely, in the case in which the PLL output signal fout is used as the first input signal, the number of delay-device stages in the TDC circuit 30 can be decreased by a factor of several tens to several hundreds as compared with the case in which the PLL frequency-divided signal fdiv is used as the first input signal. This also enables the delay time $\Delta t$ to be reduced further, thereby increasing the resolution of the TDC circuit 30.

Optimum band detection in the case in which the PLL output signal fout is used as the first input signal in the TDC circuit 30 somewhat differs from that in the case in which the PLL frequency-divided signal fdiv is used as the first input signal in the TDC circuit 30. Specifically, in the latter case, the frequency of the reference signal fref and the frequency of the PLL frequency-divided signal fdiv are simply compared, while in the former case, the frequency divisor number N in the PLL circuit is compared with how much greater the frequency of the PLL output signal fout is than that of the reference signal fref, that is, fout/fref. According to the principle of the PLL circuit, the output frequency fout of the PLL circuit is expressed as fout=N×fref. That is, N=fout/fref. On the other hand, if a PLL output frequency obtained when a band whose frequency characteristics are higher than those of the optimum band is selected is foutH (fout<foutH), the TDC circuit 30 and the first frequency counter 32 calculate foutH/fref. And a comparison between foutH/fref and N=fout/fref shows that (foutH/fref)>N, which indicates that the oscillation frequency in the currently selected band is higher as compared with the optimum band. Conversely, if a PLL output frequency obtained when a band whose frequency characteristics are lower than those of the optimum band is selected is foutL (foutL<fout), the TDC circuit 30 and the first frequency counter 32 calculate foutL/fref. And a comparison between foutL/fref and N=fout/fref shows that (foutL/fref)<N, which indicates that the oscillation frequency in the currently selected band is lower as compared with the optimum band.

Figure 12:
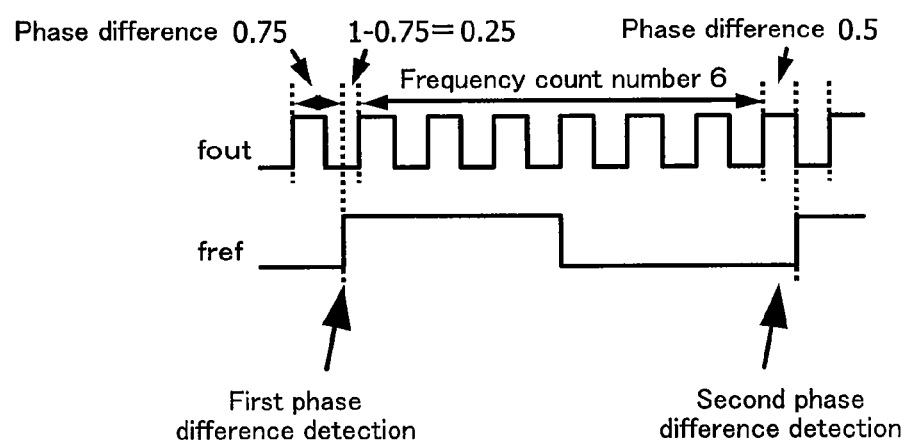
FIG. 12 is a view for explaining operation in which a frequency difference between the reference signal fref and the PLL output signal fout is detected in the PLL circuit of the third embodiment of the invention.

A case in which the frequency of a reference signal fref and that of a PLL output signal fout shown in FIG. 12 are compared will be considered as a specific example. It is assumed that the count number for the PLL output signal fout counted by the frequency counter in one cycle of the reference signal fref was six. Furthermore, if the phase difference detected in the first phase difference detection was 0.75 and the phase difference detected in the second phase difference detection was 0.5, it is found that the equation (the frequency count number)+(1−(the phase difference detected in the first phase difference detection))+(the phase difference detected in the second phase difference detection)=6+(1−0.75)+0.5=6.75 indicates the value of (the PLL output frequency obtained in the currently selected band)/(the frequency of fref). If, in this case, the frequency divisor number N in the PLL circuit is greater than 6.75, this means that the oscillation frequency in the currently selected band is lower as compared with the optimum band. Conversely, if the frequency divisor number N in the PLL circuit is smaller than 6.75, this means that the oscillation frequency in the currently selected band is higher as compared with the optimum band. Therefore, a transition to the next band is made so that the operation for detecting the optimum oscillation frequency band corresponding to the PLL output frequency is continued.

As described above, in the PLL circuit according to the third embodiment, the TDC circuit is reduced in area and in power consumption by decreasing the number of delay-device stages in the TDC circuit.

Fourth Embodiment

Next, a fourth embodiment of the invention will be described.

Figure 13:
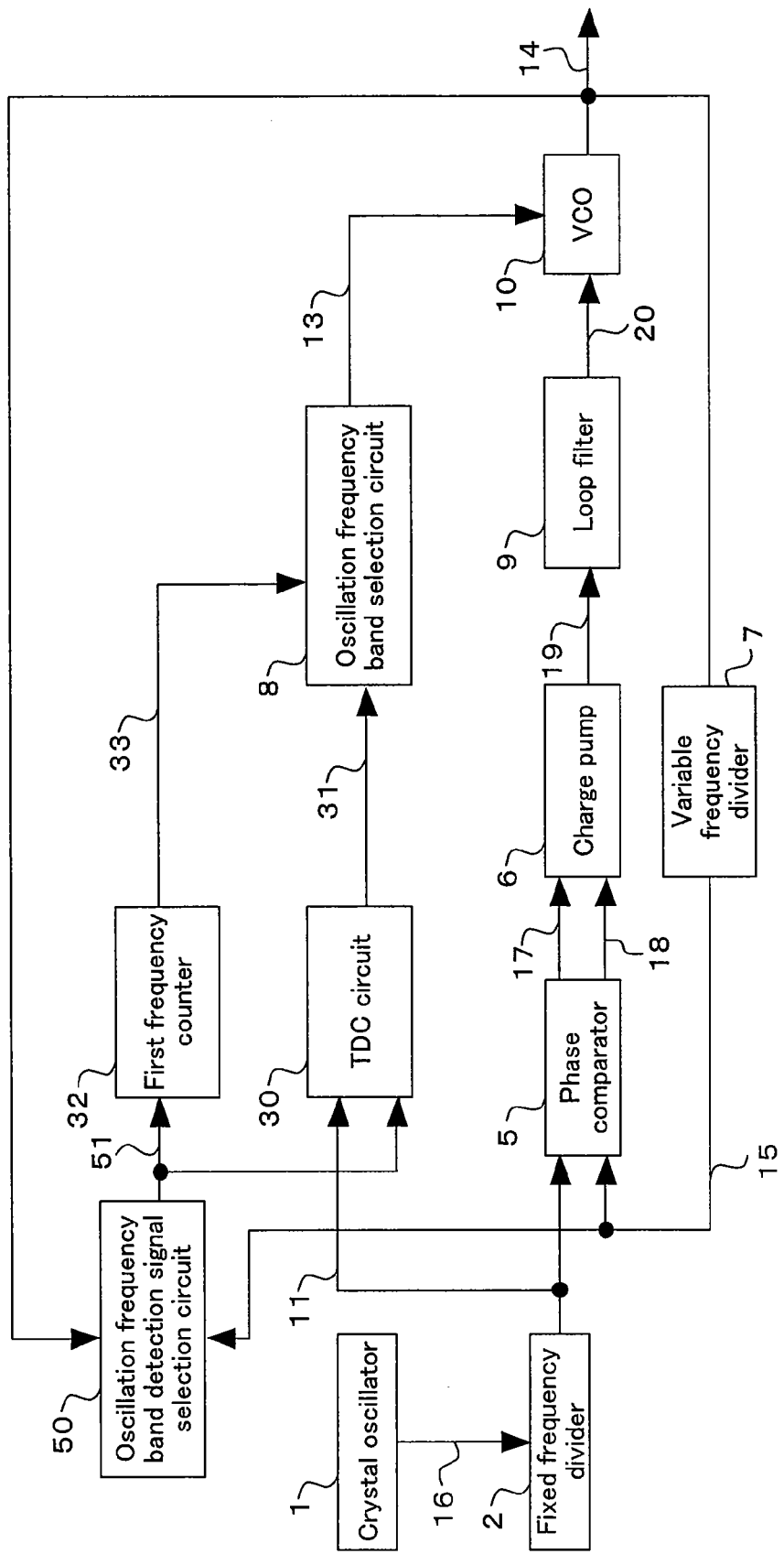
FIG. 13 illustrates the configuration of a PLL circuit according to a fourth embodiment of the invention.

FIG. 13 illustrates the configuration of a PLL circuit according to the fourth embodiment of the invention. The configuration of the PLL circuit according to the fourth embodiment differs from that of the PLL circuit according to the first embodiment in that an oscillation frequency band detection signal selection circuit 50, which selects and outputs either a PLL frequency-divided signal 15 or a PLL output signal 14, is included and that an oscillation frequency band detection signal 51, which is the output signal of the oscillation frequency band detection signal selection circuit 50, is input to both a first frequency counter 32 and a TDC circuit 30.

This is equivalent to a configuration in which the PLL circuits according to the first and third embodiments are included in one PLL circuit and the oscillation frequency band detection signal selection circuit 50 selects either the configuration of the first or third embodiment when the PLL circuit is used.

The advantage of using the PLL circuit according to the first embodiment of the invention is that the PLL circuit can operate even if the frequency of the PLL output signal fout is high. The PLL circuit according to the third embodiment of the invention, which needs a frequency counter for counting the frequency of the PLL output signal fout, has a problem in that when the PLL output signal fout has a very fast frequency of several GHz, some semiconductor process techniques may fail to enable the circuit to be capable of performing counting operation. In such a case, with the use of the PLL circuit according to the first embodiment of the invention, it becomes possible to reduce the time required to detect an optimum oscillation frequency band corresponding to the PLL output frequency, even if the frequency of the PLL output signal fout is high. However, the PLL circuit according to the first embodiment has a disadvantage in that, as stated previously, in order for the TDC circuit 30 to correctly detect a phase difference between two input signals, the number of delay-circuit stages in the TDC circuit 30 must be increased significantly, inevitably resulting in an increase in circuit area and power consumption. On the other hand, the use of the PLL circuit according to the third embodiment of the invention provides the advantage that the number of delay-circuit stages in the TDC circuit 30 is significantly reduced, thereby achieving a reduction in circuit size and power consumption. Nevertheless, the PLL circuit according to the third embodiment has a disadvantage in that when the frequency of the PLL output signal fout is high, some semiconductor process techniques may fail to enable the frequency counter to operate.

In this way, the PLL circuits according to the first and third embodiments of the invention have complimentary advantages and disadvantages, and therefore the configuration in which one of these PLL circuits is selected according to the frequency of the PLL output signal fout provides maximum reduction in power consumption. In the PLL circuit in which the frequency range of the PLL output signal fout to be used is wide, when the PLL output signal fout has a frequency at which the frequency counter can operate, the oscillation frequency band detection signal selection circuit 50 outputs the PLL frequency-divided signal 15 as the oscillation frequency band detection signal 51, which leads to an increase in power consumption but allows a correct phase comparison to be performed. On the other hand, when the PLL output signal fout has a frequency at which the frequency counter cannot operate, the oscillation frequency band detection signal selection circuit 50 outputs the PLL output signal 14 as the oscillation frequency band detection signal 51 so as to decrease the number of delay-circuit stages to be used in the TDC circuit 30, thereby reducing power consumption by stopping the delay circuits that are not to be used.

In this manner, in the PLL circuit according to the fourth embodiment of the invention, the addition of the oscillation frequency band detection signal selection circuit 50, which is an easy method, enables the PLL circuit to reduce power consumption according to the PLL output signal fout to be used.

Fifth Embodiment

Figure 14:
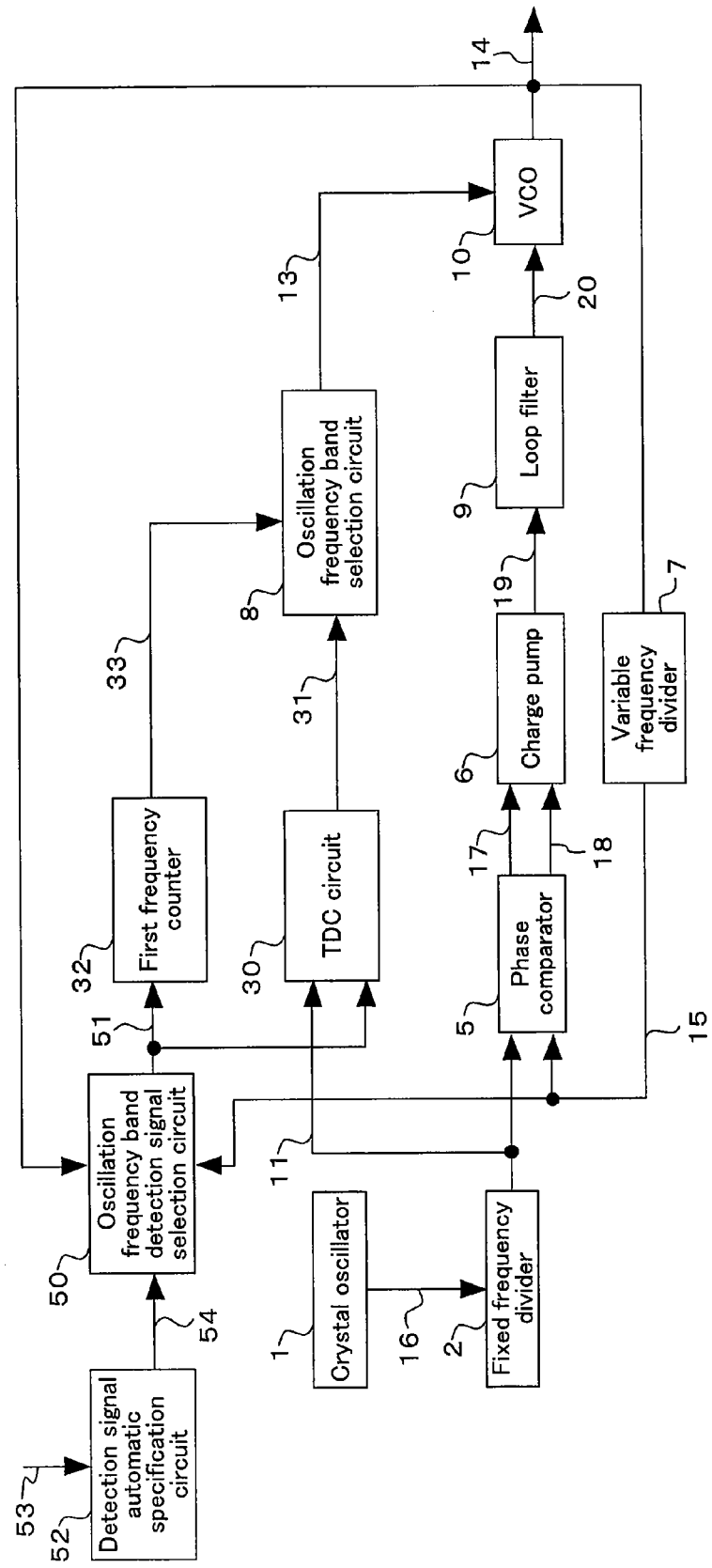
FIG. 14 illustrates the configuration of a PLL circuit according to a fifth embodiment of the invention.

FIG. 14 illustrates the configuration of a PLL circuit according to a fifth embodiment of the invention.

As compared with the PLL circuit according to the fourth embodiment, the configuration of the PLL circuit according to the fifth embodiment is characterized by including a detection signal automatic specification circuit 52.

This detection signal automatic specification circuit 52 compares PLL output frequency data 53 with a frequency counter's operation upper-limit frequency stored in advance. If the value of the PLL output frequency data is smaller, the detection signal automatic specification circuit 52 outputs a detection signal specification signal 54 to an oscillation frequency band detection signal selection circuit 50 so that the oscillation frequency band detection signal selection circuit 50 selects a PLL output frequency 14. On the other hand, if the value of the PLL output frequency data is greater, the detection signal automatic specification circuit 52 outputs the detection signal specification signal 54 to the oscillation frequency band detection signal selection circuit 50 so that the oscillation frequency band detection signal selection circuit 50 selects a PLL frequency-divided frequency 15. Accordingly, power consumption by the TDC circuit is always reduced to the maximum degree even in the PLL circuit in which the PLL output frequency is varied continuously.

Sixth Embodiment

Figure 15:
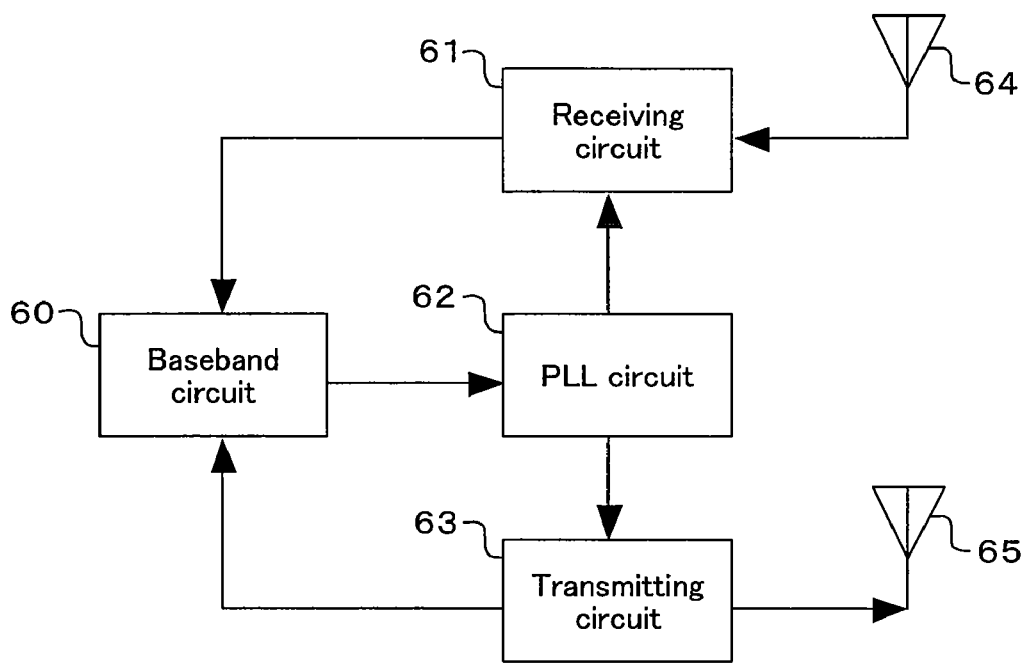
FIG. 15 illustrates an example of a wireless communication system according to a sixth embodiment of the invention.
Figure 16:
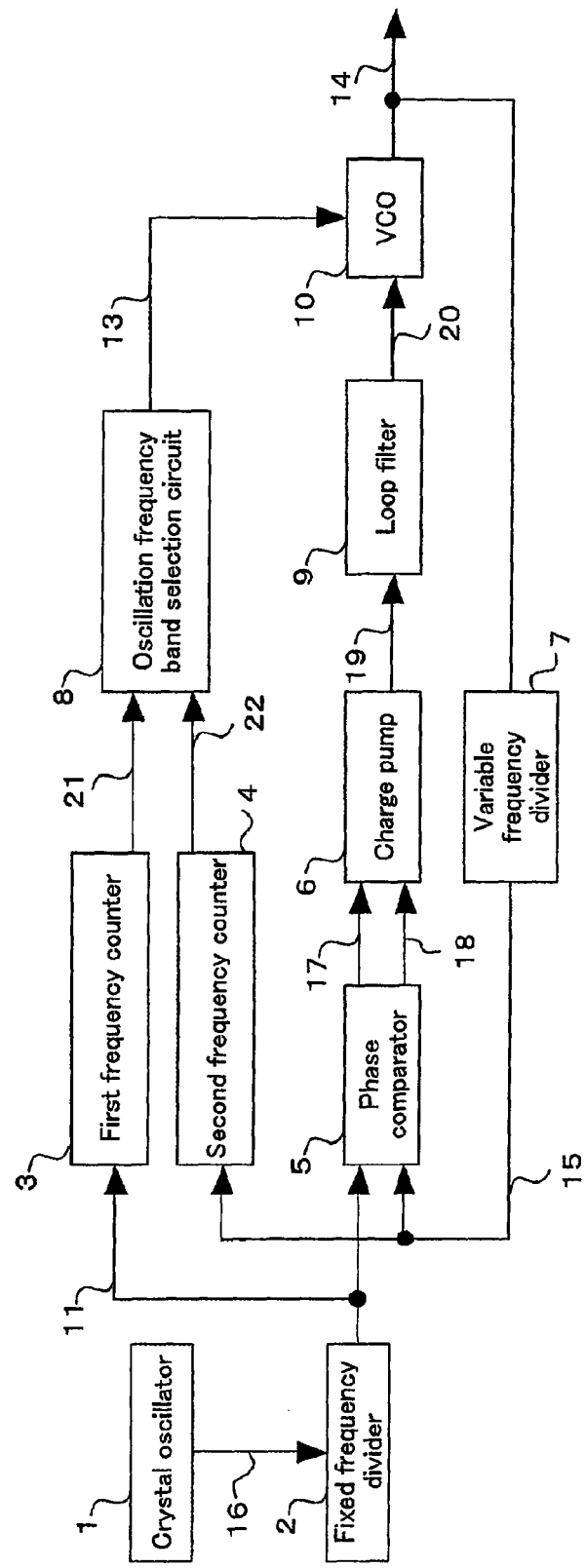
FIG. 16 illustrates an example of a conventional PLL circuit including a VCO having a plurality of oscillation frequency bands.
Figure 17:
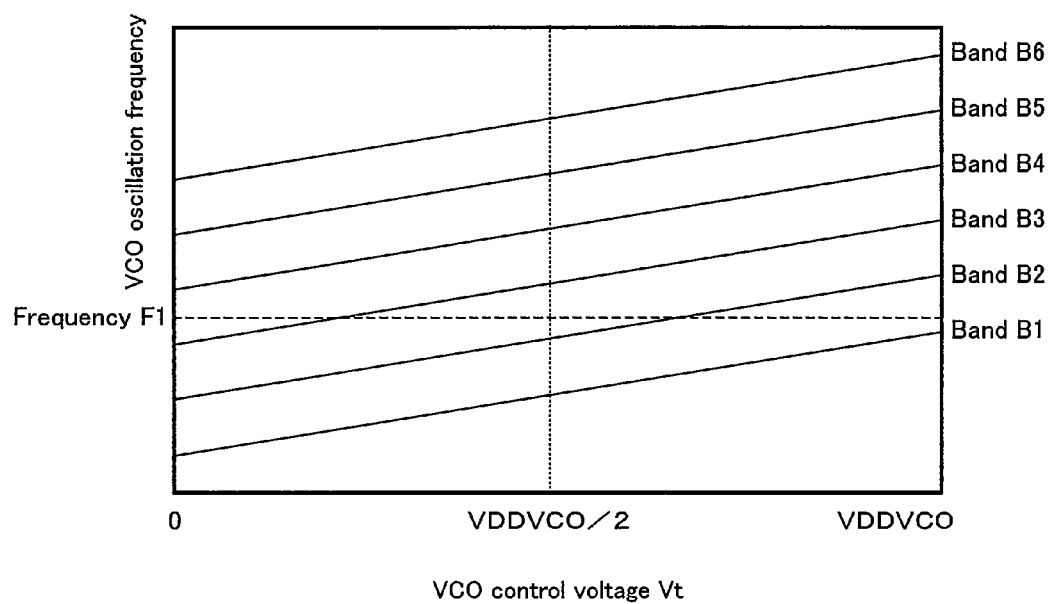
FIG. 17 illustrates control voltage/oscillation frequency characteristics in each oscillation frequency band of a VCO having a plurality of oscillation frequency bands.

FIG. 15 illustrates an example of a wireless communication system to which a PLL circuit according to this embodiment is applied.

The PLL circuit according to this embodiment allows the wireless communication system to reduce communication setup time and power consumption. The example shown in FIG. 15 includes a baseband circuit 60, a receiving circuit 61, a transmitting circuit 63, a receiving antenna 64, a transmitting antenna 65, and one of the PLL circuits described in the first to fifth embodiments of the invention as a PLL circuit 62.

It should be noted that configurations for the wireless communication system are unlimited, and the invention is also applicable to wireless communication systems having configurations other than that shown in FIG. 15 and to other various types of electronic devices using PLL circuits.

What is claimed is:

1. A PLL circuit comprising:
a voltage-controlled oscillator having a plurality of oscillation frequency bands;
an oscillation frequency band selection circuit for detecting a required oscillation frequency band from the plurality of oscillation frequency bands of the voltage-controlled oscillator;
a variable frequency divider for dividing a frequency of a PLL output signal, which is an output signal from the voltage-controlled oscillator, by a frequency divisor number to output a PLL frequency-divided signal;
a TDC circuit for detecting and outputting a phase difference between a predetermined reference signal and the PLL frequency-divided signal from the variable frequency divider; and
a frequency counter for counting the number of rising edges of the PLL frequency-divided signal from the variable frequency divider for a specified period of time and outputting the count number, wherein the oscillation frequency band selection circuit detects and selects an optimum oscillation frequency band corresponding to a predetermined PLL output frequency by using a signal indicating the phase difference between the reference signal and the PLL frequency-divided signal detected by the TDC circuit.

2. A PLL circuit comprising:

a voltage-controlled oscillator having a plurality of oscillation frequency bands;

an oscillation frequency band selection circuit for detecting a required oscillation frequency band from the plurality of oscillation frequency bands of the voltage-controlled oscillator;

a variable frequency divider for dividing a frequency of a PLL output signal, which is an output signal from the voltage-controlled oscillator, by a frequency divisor number to output a PLL frequency-divided signal;

a TDC circuit for detecting and outputting a phase difference between a predetermined reference signal and the PLL frequency-divided signal from the variable frequency divider;

a first frequency counter for counting the number of rising edges of the PLL frequency-divided signal from the variable frequency divider for a specified period of time and outputting the count number; and a second frequency counter for counting the number of rising edges of the reference signal for a specified period of time and outputting the count number, wherein the oscillation frequency band selection circuit detects and selects an optimum oscillation frequency band corresponding to a predetermined PLL output frequency by using the count number indicating the frequency of the PLL frequency-divided signal counted by the first frequency counter, the count number indicating the frequency of the reference signal counted by the second frequency counter, and a signal indicating the phase difference between the reference signal and the PLL frequency-divided signal detected by the TDC circuit.

3. A PLL circuit comprising:

a voltage-controlled oscillator having a plurality of oscillation frequency bands;

an oscillation frequency band selection circuit for detecting a required oscillation frequency band from the plurality of oscillation frequency bands of the voltage-controlled oscillator;

a variable frequency divider for dividing a frequency of a PLL output signal, which is an output signal from the voltage-controlled oscillator, by a frequency divisor number to output a PLL frequency-divided signal;

a TDC circuit for detecting and outputting a phase difference between a predetermined reference signal and the PLL output signal; and a first frequency counter for counting the number of rising edges of the PLL output signal for a specified period of time and outputting the count number, wherein the oscillation frequency band selection circuit detects and selects an optimum oscillation frequency band corresponding to a predetermined PLL output frequency by using the count number indicating the frequency of the PLL output signal counted by the first frequency counter and a signal indicating the phase difference between the reference signal and the PLL output signal detected by the TDC circuit.

4. A PLL circuit comprising:

a voltage-controlled oscillator having a plurality of oscillation frequency bands;

an oscillation frequency band selection circuit for detecting a required oscillation frequency band from the plurality of oscillation frequency bands of the voltage-controlled oscillator;

a variable frequency divider for dividing a frequency of a PLL output signal, which is an output signal from the voltage-controlled oscillator, by a frequency divisor number to output a PLL frequency-divided signal;

a TDC circuit to which a predetermined reference signal and another signal are input and which detects and outputs a phase difference between these two input signals;

a first frequency counter for counting the number of rising edges of an input signal for a specified period of time and outputting the count number; and an oscillation frequency band detection signal selection circuit for selecting either the PLL frequency-divided signal from the variable frequency divider or the PLL output signal from the voltage-controlled oscillator as the other of the two signals input to the TDC circuit, which is other than the reference signal, and as the signal input to the first frequency counter, wherein the oscillation frequency band selection circuit detects and selects an optimum oscillation frequency band corresponding to a predetermined PLL output frequency by using the frequency count number counted by the first frequency counter and a signal indicating the phase difference between the reference signal and the signal selected by the oscillation frequency band detection signal selection circuit detected by the TDC circuit.

5. The PLL circuit of claim 4, comprising a detection signal automatic specification circuit for specifying, as an instruction to the oscillation frequency band detection signal selection circuit, whether the oscillation frequency band detection signal selection circuit should select either the PLL frequency-divided signal from the variable frequency divider or the PLL output signal from the voltage-controlled oscillator, in accordance with the predetermined PLL output frequency.

6. A wireless communication system comprising:
the PLL circuit of claim 1, and
a transmitting and receiving circuit for wireless communication.

7. A wireless communication system comprising:
the PLL circuit of claim 2, and
a transmitting and receiving circuit for wireless communication.

8. A wireless communication system comprising:
the PLL circuit of claim 3, and
a transmitting and receiving circuit for wireless communication.

9. A wireless communication system comprising:
the PLL circuit of claim 4, and
a transmitting and receiving circuit for wireless communication.

* * * * *